(12) United States Patent
Xu et al.

(10) Patent No.: US 10,396,285 B2
(45) Date of Patent: Aug. 27, 2019

(54) APPARATUS AND METHOD FOR DETECTING PRESENCE OF ATTENUATION IN OLED DEVICE

(71) Applicants: BOE Technology Group Co., Ltd., Beijing (CN); Hefei Xinsheng Optoelectronics Technology Co., Ltd, Hefei (CN)

(72) Inventors: Kai Xu, Beijing (CN); Rui Peng, Beijing (CN); Zhijie Ye, Beijing (CN); Yue Hu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/736,349

(22) PCT Filed: Jun. 30, 2017

(86) PCT No.: PCT/CN2017/091065
§ 371 (c)(1),
(2) Date: Dec. 14, 2017

(87) PCT Pub. No.: WO2018/024060
PCT Pub. Date: Feb. 8, 2018

(65) Prior Publication Data
US 2019/0006595 A1    Jan. 3, 2019

(30) Foreign Application Priority Data
Aug. 4, 2016 (CN) .......................... 2016 1 0634740

(51) Int. Cl.
*G01R 31/26* (2014.01)
*H01L 51/00* (2006.01)

(52) U.S. Cl.
CPC .......... *H01L 51/0031* (2013.01); *G01R 31/26* (2013.01); *G01R 31/2642* (2013.01)

(58) Field of Classification Search
CPC .. G01R 31/44; G01R 31/2635; G01R 31/025; G01R 31/2642; G09G 3/006; G09G 3/3233; H01L 51/0031
(Continued)

(56) References Cited

U.S. PATENT DOCUMENTS

2011/0130981 A1\* 6/2011 Chaji .................... G09G 3/006
702/58
2014/0354285 A1\* 12/2014 Kim .................... G09G 3/3233
324/414
(Continued)

FOREIGN PATENT DOCUMENTS

CN 101900786 A 12/2010
CN 102222455 A 10/2011
(Continued)

OTHER PUBLICATIONS

Okimi, Hiroshi, et al. "Enhancement of the Magnetic Field Effect on the Emission Intensity of an Organic Light-Emitting Diode Induced by the Operating Time." Japanese Journal of Applied Physics48.6R (2009): 061502. (Year: 2009).\*
(Continued)

*Primary Examiner* — Christopher P McAndrew
(74) *Attorney, Agent, or Firm* — Banner & Witcoff, Ltd.

(57) ABSTRACT

An apparatus and a method for detecting presence of attenuation in the OLED device are provided. The apparatus for detecting presence of attenuation in the OLED device includes: a difference function construction circuit, an integrating circuit, a comparing circuit and a determining circuit. The method for detecting presence of attenuation in the OLED device includes: constructing a first light brightness
(Continued)

difference function and a second light brightness difference function before and after aging, integrating the first function and the second function, comparing two integrals, and determining whether or not intrinsic attenuation is present in a light emitting material of a light emitting layer in the OLED device. The apparatus for detecting presence of attenuation in the OLED device is configured for executing the method for detecting presence of attenuation in the OLED device.

19 Claims, 8 Drawing Sheets

(58) Field of Classification Search
USPC .......................................................... 324/414
See application file for complete search history.

(56) References Cited

U.S. PATENT DOCUMENTS

| | | | |
|---|---|---|---|
| 2015/0054542 A1* | 2/2015 | Song | G09G 3/006 324/762.01 |
| 2016/0103170 A1* | 4/2016 | Yang | G01R 31/2635 702/65 |
| 2016/0104402 A1* | 4/2016 | Kim | G09G 3/006 324/762.07 |

FOREIGN PATENT DOCUMENTS

| | | |
|---|---|---|
| CN | 103954898 A | 7/2014 |
| CN | 104617226 A | 5/2015 |
| CN | 106250641 A | 12/2016 |
| JP | 2006278035 A | 10/2006 |

OTHER PUBLICATIONS

Joshi, Gajadhar, et al. "Separating hyperfine from spin-orbit interactions in organic semiconductors by multi-octave magnetic resonance using coplanar waveguide microresonators." Applied Physics Letters 109.10 (2016): 103303. (Year: 2016).*
Tai, Sheng-Chieh, et al. "Evidence of birefringence and anomalous electromagnetic-pulse propagation in an organic light-emitting diode." Microwave and Optical Technology Letters 45.5 (2005): 450-452. (Year: 2005).*
Okimi, Hiroshi, etal. "Enhancement of the Magnetic Field Effect on the Emission Intensity of an Organic Light-Emitting Diode Induced by the Operating Time." Japanese Journal of Applied Physics 48.6R (2009): 061502. (Year: 2009) (Year: 2009).*
Joshi, Gajadhar, et al. "Separating hyperfine from spin-orbit interactions in organic semiconductors by multi-octave magnetic resonance using coplanar waveguide nnicroresonators." Applied Physics Letters 109.10 (2016): 103303. (Year: 2016) (Year: 2016).*
Tai, Sheng-Chieh, etal. "Evidence of birefringence and anomalous electromagnetic-pulse propagation in an organic light-emitting diode." Microwave and Optical Technology Letters 45.5 (2005): 450-452. (Year: 2005) (Year: 2005).*
Sep. 1, 2017—International Search Report and Written Opinion Appn PCT/CN2017/091065 with Eng Tran.

* cited by examiner

APPARATUS AND METHOD FOR DETECTING PRESENCE OF ATTENUATION IN OLED DEVICE

The application is a U.S. National Phase Entry of International Application No. PCT/CN2017/091065 filed on Jun. 30, 2017, designating the United States of America and claiming priority to Chinese Patent Application No. 201610634740.X filed on Aug. 4, 2016. The present application claims priority to and the benefit of the above-identified applications and the above-identified applications are incorporated by reference herein in their entirety.

TECHNICAL FIELD

Embodiments of the present disclosure relate to an apparatus for detecting presence of attenuation in an OLED device and a method for the same.

BACKGROUND

An organic light emitting display (OLED) device is a type of active light-emitting display device, which, as compared with a liquid crystal display, has advantages of faster response, higher contrast, wider viewing angle, and so on, and draws people's more attention.

In an OLED device, each OLED circuit includes an anode layer, a cathode layer and an organic layer provided between the anode layer and the cathode layer. The organic layer includes an electron transport layer and a hole transport layer, and a light emitting layer located between the electron transport layer and the hole transport layer. In the OLED devices such as the OLED displays, attenuation will occur to the organic layer with increase of usage time, which greatly affects the service life of the OLED displays. Therefore, an apparatus and method for detecting the attenuation of the OLED devices is needed at present, which is capable of determining whether or not intrinsic attenuation is present in a light emitting material of the light emitting layer in the OLED devices.

SUMMARY

In first aspect of the disclosure, it is provided an apparatus for detecting presence of attenuation in an OLED device, comprising: a difference function construction circuit, configured for constructing a first light brightness difference function $f_1(x)$, according to a difference between light brightness of the OLED device under a first luminous constraint and light brightness of the OLED device under a second luminous constraint, before aging of the OLED device; constructing a second light brightness difference function $f_2(x)$, according to a difference between light brightness of the OLED device under the first luminous constraint and light brightness of the OLED device under the second luminous constraint, after aging of the OLED device; wherein, the first luminous constraint comprises a variable magnetic field, the second luminous constraint comprises a constant microwave and a variable magnetic field, and x is an intensity of the variable magnetic field; an integrating circuit, configured for integrating the first light brightness difference function $f_1(x)$, to obtain a first integration result Ena, and integrating the second light brightness difference function $f_2(x)$, to obtain a second integration result Ea, within an intensity range of the variable magnetic field; a comparing circuit, configured for comparing $$\frac{La}{Ea} \text{ with } \frac{Lna}{Ena};$$

wherein, Lna is light brightness of a pre-aging OLED device under a non-luminous constraint, and La is light brightness of a post-aging OLED device under the non-luminous constraint; and a determining circuit, configured for determining the presence of intrinsic attenuation in a light emitting material of a light emitting layer in the OLED device, according to a comparison result between $$\frac{La}{Ea} \text{ and } \frac{Lna}{Ena}.$$

In at least one of embodiments, the difference function construction circuit comprises a function constructing sub-circuit and a difference operating sub-circuit connected with an output terminal of the function constructing sub-circuit; and the output terminal of the difference operating sub-circuit is connected with an input terminal of the integrating circuit; the function constructing sub-circuit is configured for storing the intensity of the variable magnetic field, constructing a first pre-aging light brightness function $f_{11}(x)$ characterizing a first pre-aging light brightness curve, according to the intensity of the variable magnetic field and the light brightness of the OLED device under the first luminous constraint before aging of the OLED device, and constructing a second pre-aging light brightness function $f_{21}(x)$ characterizing a second pre-aging light brightness curve, according to the intensity of the variable magnetic field and the light brightness of the OLED device under the second luminous constraint before aging of the OLED device; constructing a first post-aging light brightness function $f_{12}(x)$ characterizing a first post-aging light brightness curve, according to the intensity of the variable magnetic field and the light brightness of the OLED device under the first luminous constraint after aging of the OLED device, and constructing a second post-aging light brightness function $f_{22}(x)$ characterizing a second post-aging light brightness curve, according to the intensity of the variable magnetic field and the light brightness of the OLED device under the second luminous constraint after aging of the OLED device; the difference operating sub-circuit is configured for constructing the first light brightness difference function $f_1(x)$, according to the first pre-aging light brightness function $f_{11}(x)$ and the second pre-aging light brightness function $f_{21}(x)$; and constructing the second light brightness difference function $f_2(x)$, according to the first post-aging light brightness function $f_{12}(x)$ and the second post-aging light brightness function $f_{22}(x)$; wherein, $f_1(x)=|f_{11}(x)-f_{21}(x)|$, $f_2(x)=|f_{12}(x)-f_{22}(x)|$.

In at least one of embodiments, the determining circuit is configured for determining that intrinsic attenuation is non-present in the light emitting material of the light emitting layer in the OLED device, if $$\frac{La}{Ea} \geq \frac{Lna}{Ena};$$

and determining that intrinsic attenuation is present in the light emitting material of the light emitting layer in the OLED device, if $$\frac{La}{Ea} < \frac{Lna}{Ena}.$$

In at least one of embodiments, the apparatus further comprises a data obtaining circuit, and an output terminal of the data obtaining circuit is respectively connected with an input terminal of the difference function construction circuit and an input terminal of the comparing circuit; the data obtaining circuit is configured for obtaining the light brightness of the OLED device under the first luminous constraint and the light brightness of the OLED device under the second luminous constraint, before and after aging of the OLED device; and further configured for obtaining light brightness Lna of the pre-aging OLED device under the non-luminous constraint and the light brightness La of the post-aging OLED device under the non-luminous constraint; the comparing circuit is configured for storing the light brightness Lna of the pre-aging OLED device under the non-luminous constraint and the light brightness La of the post-aging OLED device under the non-luminous constraint, and comparing Lna with La; the determining circuit is further configured for determining whether or not the aging occurs to the OLED device, according to the comparison result between Lna and La.

In at least one of embodiments, the determining circuit is configured for determining that aging occurs to the OLED device, if La<Lna; and determining that aging does not occur to the OLED device, if La=Lna.

In at least one of embodiments, the apparatus further comprises: a magnetic field generating member, a microwave generating member and an optical measuring member; an output terminal of the optical measuring member being connected with the data obtaining circuit; the magnetic field generating member is configured for providing a variable magnetic field for the OLED device; the microwave generating member is configured for providing a constant microwave for the OLED device; the optical measuring member is configured for measuring the light brightness of the OLED device under the first luminous constraint and the light brightness of the OLED device under the second luminous constraint, before and after aging of the OLED device; and, measuring the light brightness of the OLED device under the non-luminous constraint, before and after aging of the OLED device.

In at least one of embodiments, the magnetic field generating member is a controllable excitation power supply; a microwave stage for carrying the OLED device is provided in a magnetic field provided by the controllable excitation power supply; a transmitting terminal of the microwave generating member is connected with the microwave stage through a waveguide tube.

In at least one of embodiments, the optical measuring apparatus is an optical power meter or a photomultiplier tube.

In at least one of embodiments, the apparatus further comprises a power supply for supplying power for the OLED device.

In at least one of embodiments, a microwave frequency of the constant microwave ranges from 10 GHz to 20 GHz, and the intensity of the variable magnetic field ranges from 0 mT to 500 mT.

In first aspect of the disclosure, it is provided an apparatus for detecting presence of attenuation in an OLED device, comprising: a difference function construction circuit, configured for constructing a first light brightness difference function $f_1(x)$, according to a difference between light brightness of the OLED device under a first luminous constraint and light brightness of the OLED device under a second luminous constraint, before aging of the OLED device; constructing a second light brightness difference function $f_2(x)$, according to a difference between light brightness of the OLED device under the first luminous constraint and light brightness of the OLED device under the second luminous constraint, after aging of the OLED device; wherein, the first luminous constraint comprises a variable magnetic field, the second luminous constraint comprises a constant microwave and a variable magnetic field, and x is an intensity of the variable magnetic field; an integrating circuit, configured for integrating the first light brightness difference function $f_1(x)$, to obtain a first integration result Ena, and integrating the second light brightness difference function $f_2(x)$, to obtain a second integration result Ea, within an intensity range of the variable magnetic field; a comparing circuit, configured for comparing $$\frac{La}{Ea} \text{ with } \frac{Lna}{Ena};$$

wherein, Lna is light brightness of a pre-aging OLED device under a non-luminous constraint, and La is light brightness of a post-aging OLED device under the non-luminous constraint; and a determining circuit, configured for determining the presence of intrinsic attenuation in a light emitting material of a light emitting layer in the OLED device, according to a comparison result between $$\frac{La}{Ea} \text{ and } \frac{Lna}{Ena}.$$

[0005.1] In at least one of embodiments, constructing a first light brightness difference function f1(x), according to a difference between light brightness of the OLED device under a first luminous constraint and light brightness of the OLED device under a second luminous constraint, before aging of the OLED device, comprises: constructing a first pre-aging light brightness function f11(x) characterizing a first pre-aging light brightness curve, according to the intensity of the variable magnetic field and the light brightness of the OLED device under the first luminous constraint before aging of the OLED device; constructing a second pre-aging light brightness function f21(x) characterizing a second pre-aging light brightness curve, according to the intensity of the variable magnetic field and the light brightness of the OLED device under the second luminous constraint before aging of the OLED device; constructing the first light brightness difference function f1(x), according to the first pre-aging light brightness function f11(x) and the second pre-aging light brightness function f21(x); wherein, $f_1(x)=|f_{11}(x)-f_{21}(x)|$.

In at least one of embodiments, the method for constructing a second light brightness difference function f2(x), according to a difference between light brightness of the OLED device under a first luminous constraint and light brightness of the OLED device under a second luminous constraint, after aging of the OLED device, comprises: constructing a first post-aging light brightness function f12(x) characterizing a first post-aging light brightness curve, according to the intensity of the variable magnetic field and the light brightness of the OLED device under the first luminous constraint after aging of the OLED device, and constructing a second post-aging light brightness function f22(x) characterizing a second post-aging light brightness curve, according to the intensity of the variable magnetic field and the light brightness of the OLED device under the second luminous constraint after aging of the OLED device; constructing the second light brightness difference function f2(x), according to the first post-aging light brightness function f12(x) and the second post-aging light brightness function f22(x); wherein, $f_2(x)=|_{12}(x)-f_{22}(x)|$.

In at least one of embodiments, determining the presence of intrinsic attenuation in a light emitting material of a light emitting layer in the OLED device, according to a comparison result between $$\frac{La}{Ea} \text{ and } \frac{Lna}{Ena}$$

comprises: determining that the intrinsic attenuation is non-present in the light emitting material of the light emitting layer in the OLED device, if $$\frac{La}{Ea} \geq \frac{Lna}{Ena};$$

and determining that intrinsic attenuation is present in the light emitting material of the light emitting layer in the OLED device, if $$\frac{La}{Ea} < \frac{Lna}{Ena}.$$

In at least one of embodiments, the method further comprises: obtaining the light brightness of the OLED device under the first luminous constraint and the light brightness of the OLED device under the second luminous constraint, before and after aging of the OLED device; and obtaining light brightness Lna of the pre-aging OLED device under the non-luminous constraint and the light brightness La of the post-aging OLED device under the non-luminous constraint; storing the light brightness Lna of the pre-aging OLED device under the non-luminous constraint and the light brightness La of the post-aging OLED device under the non-luminous constraint, and comparing Lna with La; determining whether or not the aging occurs to the OLED device, according to the comparison result between Lna and La.

In at least one of embodiments, determining whether or not aging occurs to the OLED device, according to the comparison result between Lna and La comprises: determining that aging occurs to the OLED device, if La<Lna; and determining that aging does not occur to the OLED device, if La=Lna.

In at least one of embodiments, the intensity of the variable magnetic field ranges from 0 mT to 500 mT, and a microwave frequency of the constant microwave ranges from 10 GHz to 20 GHz.

In second aspect of the disclosure, it is provided a method for detecting presence of attenuation in an OLED device, comprising: constructing a first light brightness difference function $f_1(x)$, according to a difference between light brightness of the OLED device under a first luminous constraint and light brightness of the OLED device under a second luminous constraint, before aging of the OLED device; constructing a second light brightness difference function $f_2(x)$, according to a difference between light brightness of the OLED device under a first luminous constraint and light brightness of the OLED device under a second luminous constraint, after aging of the OLED device; wherein the first luminous constraint comprises a constant microwave and a variable magnetic field, and x is an intensity of the variable magnetic field; integrating the first light brightness difference function $f_1(x)$, to obtain a first integration result Ena, and integrating the second light brightness difference function $f_2(x)$, to obtain a second integration result Ea, within an intensity range of the variable magnetic field; comparing $$\frac{La}{Ea} \text{ with } \frac{Lna}{Ena};$$

wherein, Lna is light brightness of a pre-aging OLED device under a non-luminous constraint, and La is light brightness of a post-aging OLED device under the non-luminous constraint; and determining the presence of intrinsic attenuation in a light emitting material of a light emitting layer in the OLED device, according to a comparison result between $$\frac{La}{Ea} \text{ and } \frac{Lna}{Ena}.$$

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
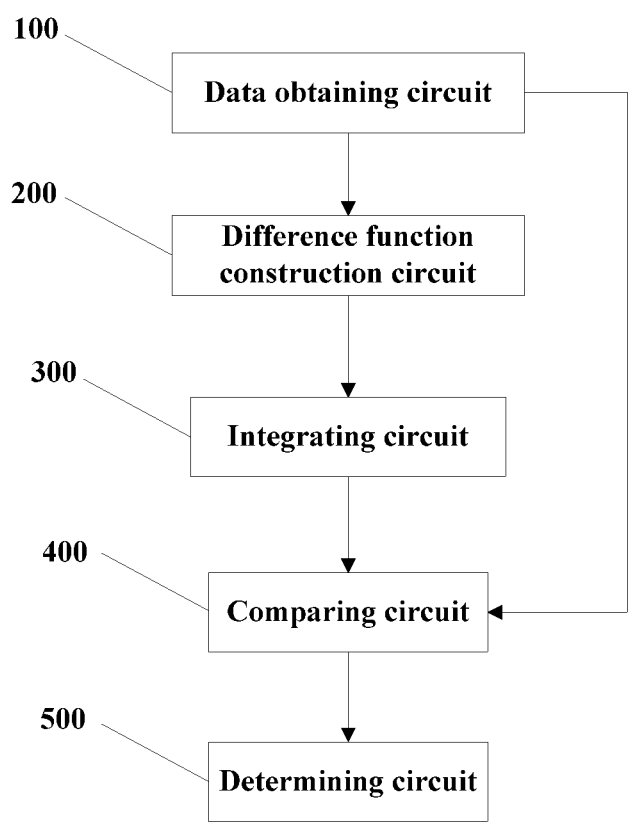
FIG. 1 is a block diagram of an apparatus for detecting presence of attenuation in an OLED device provided by an embodiment of the present disclosure.
Figure 6:
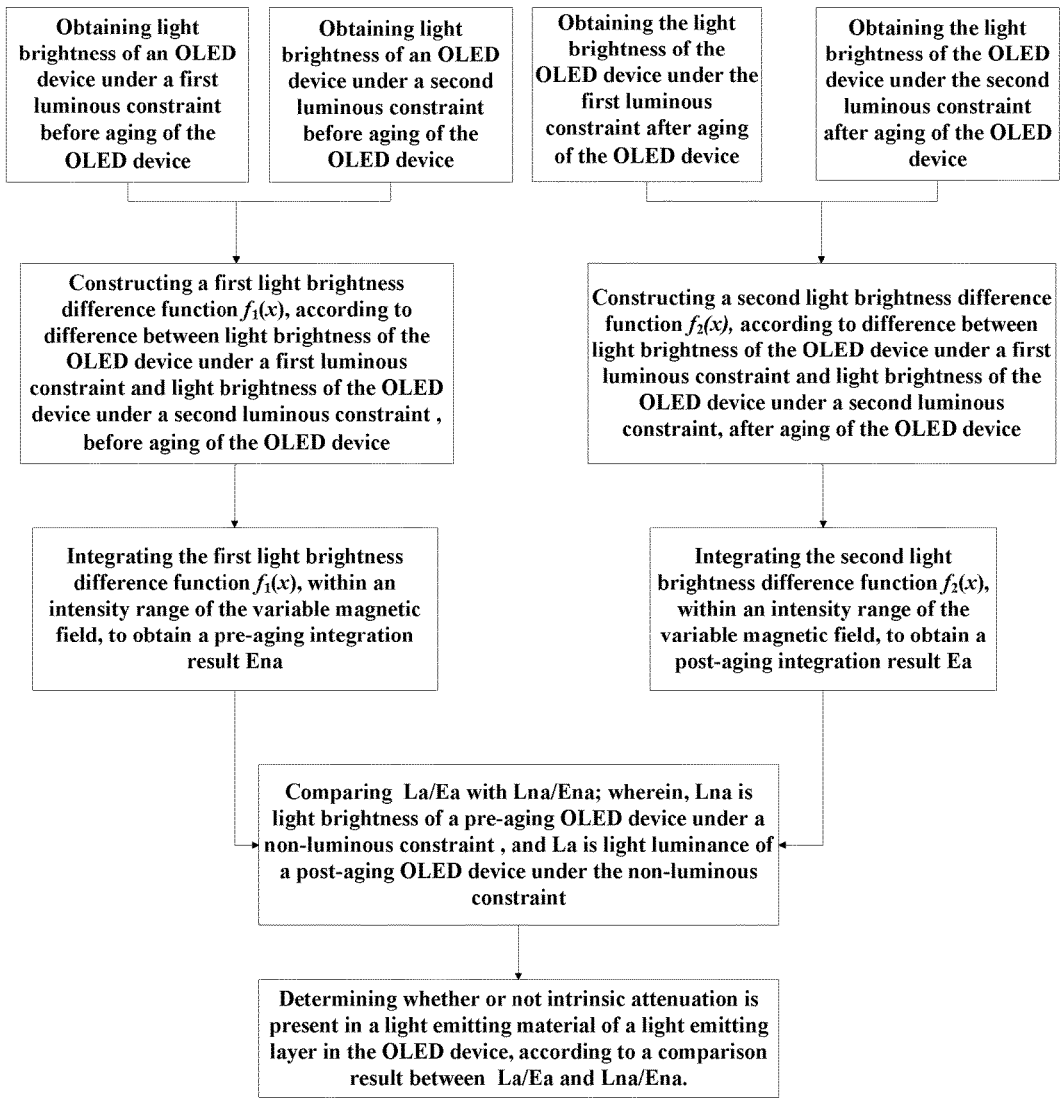
FIG. 6 is a flow chart of a method for detecting presence of attenuation in an OLED device provided by an embodiment of the present disclosure.

With reference to FIG. 1 and FIG. 6, an apparatus for detecting presence of attenuation in an OLED device provided by an embodiment of the present disclosure comprises: a difference function construction circuit 200, an integrating circuit 300, a comparing circuit 400 and a determining circuit 500. The difference function construction circuit 200 is configured for constructing a pre-aging light brightness difference function $f_1(x)$ (i.e., a first light brightness difference function), according to a difference between light brightness of the OLED device under a first luminous constraint and light brightness of the OLED device under a second luminous constraint, before aging of the OLED device; constructing a post-aging light brightness difference function $f_2(x)$ (i.e., a second light brightness difference function), according to a difference between light brightness of the OLED device under the first luminous constraint and light brightness of the OLED device under the second luminous constraint, after aging of the OLED device. The first luminous constraint is a single constraint environment, and the single constraint environment is a variable magnetic field; the second luminous constraint is a dual constraint environment, the dual constraint environment includes a constant microwave and a variable magnetic field, and x is an intensity of the variable magnetic field.

The integrating circuit 300 is configured for integrating the pre-aging light brightness difference function $f_1(x)$, to obtain a first integration result Ena, and integrating the second light brightness difference function $f_2(x)$, to obtain a second integration result Ea, within an intensity range of the variable magnetic field.

The comparing circuit 400 is configured for comparing $$\frac{La}{Ea} \text{ with } \frac{Lna}{Ena};$$

wherein, Lna is light brightness of a pre-aging OLED device under a non-luminous constraint, and La is light brightness of a post-aging OLED device under the non-luminous constraint. The "non-luminous constraint" here refers to the luminous constraint which is different from the first luminous constraint and the second luminous constraint, for example, it refers to a constant current or a constant voltage.

The determining circuit 500 is configured for determining whether or not intrinsic attenuation is present in a light emitting material of a light emitting layer in the OLED device, according to a comparison result between $$\frac{La}{Ea} \text{ and } \frac{Lna}{Ena}.$$

As an example, if $$\frac{La}{Ea} \geq \frac{Lna}{Ena},$$

the determining circuit 500 determines that intrinsic attenuation is non-present in the light emitting material of the light emitting layer in the OLED device; if $$\frac{La}{Ea} < \frac{Lna}{Ena},$$

it determines that intrinsic attenuation is present in the light emitting material of the light emitting layer in the OLED device.

In at least some of embodiments, the apparatus for detecting presence of attenuation in the OLED device provided by the above-described embodiment is configured to analyze the OLED device before aging, and the analyzing process comprises:

before the aging of the OLED device, constructing, by the difference function construction circuit 200, the pre-aging light brightness difference function $f_1(x)$, according to the difference between the light brightness of the OLED device under the first luminous constraint and the light brightness of the OLED device under the second luminous constraint;

integrating, by the integrating circuit 300, the pre-aging light brightness difference function $f_1(x)$, within the intensity range of the variable magnetic field, to obtain the first integration result Ena.

In at least some of embodiments, the apparatus for detecting presence of attenuation in the OLED device provided by the above-described embodiment is configured to analyze the OLED device after aging, and the analyzing process comprises:

after the aging of the OLED device, constructing, by the difference function construction circuit 200, the second light brightness difference function $f_2(x)$, according to the difference between the light brightness of the OLED device under the first luminous constraint and the light brightness of the OLED device under the second luminous constraint;

integrating, by the integrating circuit 300, the second light brightness difference function $f_2(x)$, within the intensity range of the variable magnetic field, to obtain the first integration result Ea.

In at least some of embodiments, after the above-described analysis is performed on the pre-aging and the post-aging OLED device with the apparatus for detecting presence of attenuation in the OLED device, the comparing circuit 400 compares $$\frac{La}{Ea} \text{ with } \frac{Lna}{Ena},$$

and then the determining circuit 500 determines whether or not intrinsic attenuation is present in the light emitting material of the light emitting layer in the OLED device, according to the comparison result between $$\frac{La}{Ea} \text{ and } \frac{Lna}{Ena}.$$

As an example, if $$\frac{La}{Ea} \geq \frac{Lna}{Ena},$$

it is determined that intrinsic attenuation is non-present in the light emitting material of the light emitting layer in the OLED device; if $$\frac{La}{Ea} < \frac{Lna}{Ena},$$

it is determined that intrinsic attenuation is present in the light emitting material of the light emitting layer in the OLED device, other than that attenuation is present in an electron transport layer, a hole transport layer, a layer interface, or other parts.

In the OLED device provided by the embodiment of the present disclosure, the first luminous constraint is the single constraint environment of the variable magnetic field, so that electrons and holes for forming excitons in both the pre-aging OLED device and the post-aging OLED device are capable of responding to change in the intensity of the magnetic field (as shown by curve b in FIG. 3), so as to emit light of different luminance. The second luminous constraint is the dual constraint environment of the constant microwave and the variable magnetic field, so that both the electrons and the holes for forming the excitons in both the pre-aging OLED device and the post-aging OLED device are capable of not only responding to change in the intensity of the magnetic field so as to emit light of different luminance, but also making sudden change to the light brightness within a certain intensity range (as shown by curve a in FIG. 3) under an effect of the constant microwave. In this way, in the apparatus for detecting presence of attenuation in the OLED device provided by the embodiment of the present disclosure, by constructing the first light brightness difference function $f_1(x)$ and the second light brightness difference function $f_2(x)$, according to the difference between the light brightness of the OLED device under the first luminous constraint and the light brightness of the OLED device under the second luminous constraint, before and after aging of the OLED device, and by integrating the same within the intensity range of the variable magnetic field, the first integration result Ena characterizing the number of excitons in the pre-aging OLED device, and the second integration result Ea characterizing the number of excitons in the post-aging OLED device may be obtained. FIG. 4 illustrates a curve graph of a difference function. However, considering the intrinsic attenuation of the light-emitting material in the light-emitting layer of the OLED device, the probability of the radiation transition present in the light-emitting layer in the OLED device decreases relative to that of the non-radiation transition, and the light emission brightness of the OLED device can characterize the probability of the radiation transition, it is possible to compare a ratio $$\frac{Lna}{Ena}$$

of the pre-aging OLED device with a ratio $$\frac{La}{Ea}$$

of the post-aging OLED device, so as to determine whether or not intrinsic attenuation is present in the light emitting material of the light emitting layer in the OLED device.

Under the second luminous constraint, both the electrons and the holes for forming the excitons in both the pre-aging OLED device and the post-aging OLED device are capable of making sudden change to the light brightness within a certain intensity range due to the effect of the constant microwave, this is because of that under the dual constraint environment of the constant microwave and the variable magnetic field of the second luminous constraint, the electrons and the holes for forming the excitons in the OLED device generate resonance response, so that sudden change occurs to the light brightness of the OLED device within a certain intensity range.

It can be understood that, after formation of the excitons in the OLED device, there is radiation transition kp and non-radiation transition knp, the radiation transition kp will emit photons, and the corresponding non-radiation transition knp will generate heat in the device to be diffused. If the light emitting material contained in the light emitting layer in the OLED device is deteriorated, the probability of the non-radiation transition knp will increase relative to the probability of the radiation transition kp, so that the light brightness of the OLED device is reduced, that is, the light brightness of the OLED device may characterize the probability of the radiation transition.

It should be noted that, in the above-described embodiment, a microwave frequency of the constant microwave is from 10 GHz to 20 GHz, for example, 10 GHz, 20 GHz, or 15 GHz, and the intensity range of the variable magnetic field is from 0 mT to 500 mT, and both of them may be selected according to an actual situation.

In order to improve accuracy of attenuation detection of the OLED device, the pre-aging OLED device and the post-aging OLED device are a same OLED device, so after the above-described analysis is performed on the pre-aging OLED device with the apparatus for detecting presence of attenuation in the OLED device, aging process is performed on the OLED device, and then the above-described analysis is performed on the pre-aging and the post-aging OLED device with the apparatus for detecting presence of attenuation in the OLED device.

It can be understood that, the pre-aging OLED device and the post-aging OLED device are OLED devices of a same type and a same batch, that is, the above-described analysis may be performed on the pre-aging OLED device with the apparatus for detecting presence of attenuation in the OLED device firstly, or the above-described analysis may also be performed on the post-aging OLED device with the apparatus for detecting presence of attenuation in the OLED device firstly; however, due to individual difference, accuracy of attenuation analysis of the OLED device may be affected.

Figure 2:
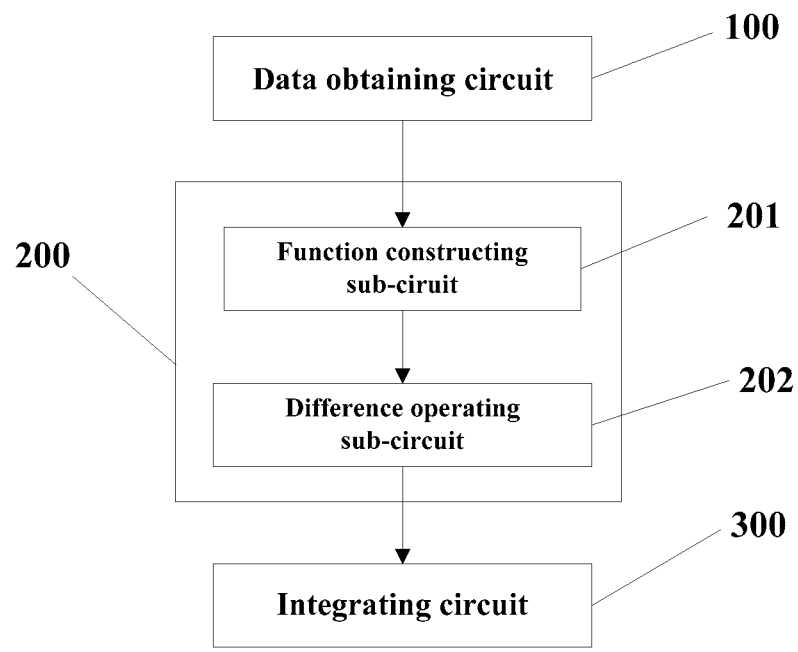
FIG. 2 is a block diagram of a function construction circuit provided by an embodiment of the present disclosure.
Figure 7:
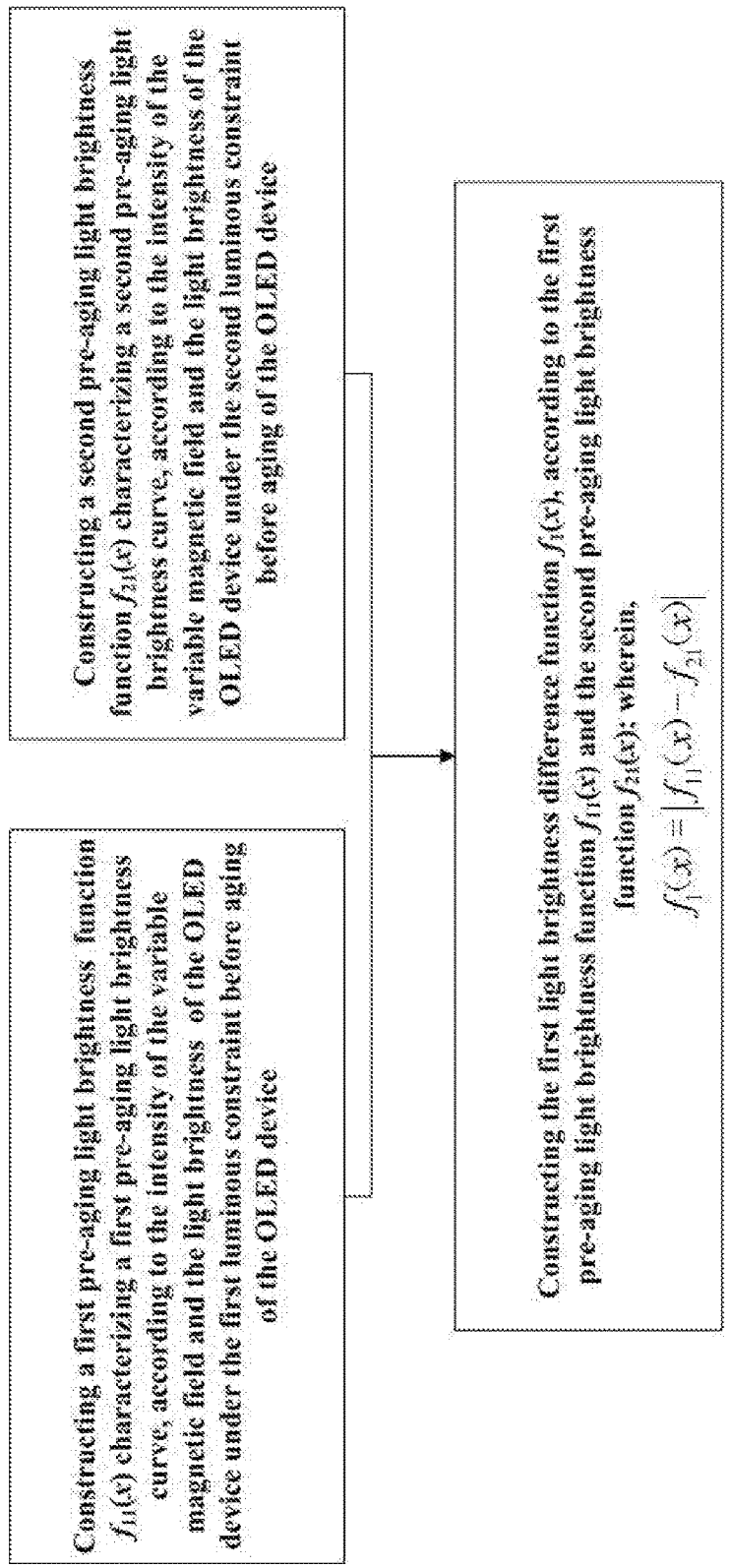
FIG. 7 is a flow chart of a pre-aging light brightness difference function $f_1(x)$ constructed in a method for detecting presence of attenuation in an OLED device provided by an embodiment of the present disclosure.
Figure 8:
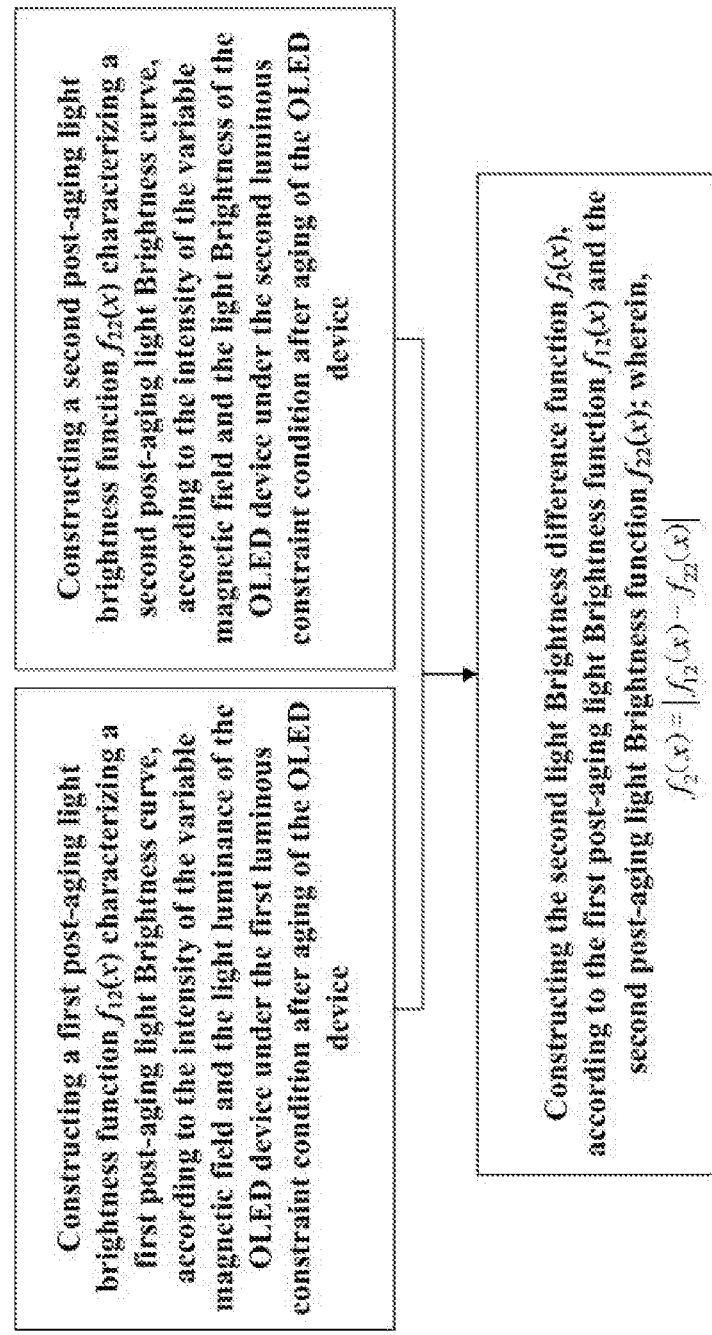
FIG. 8 is a flow chart of a second light brightness difference function $f_2(x)$ constructed in a method for detecting presence of attenuation in an OLED device provided by the embodiment of the present disclosure.

In at least some of embodiments, with reference to FIG. 2, FIG. 7 and FIG. 8, the difference function construction circuit 200 in the above-described embodiment comprises a function constructing sub-circuit 201 and a difference operating sub-circuit 202 connected with an output terminal of the function constructing sub-circuit 201; and the output terminal of the difference operating sub-circuit 202 is connected with an input terminal of the integrating circuit 300.

The function construction sub-circuit 201 is configured for storing the intensity of the variable magnetic field, constructing a first pre-aging light brightness function $f_{11}(x)$ characterizing a first pre-aging light brightness curve, according to the intensity of the variable magnetic field and the light brightness of the OLED device under the first luminous constraint before aging of the OLED device, and constructing a second pre-aging light brightness function $f_{21}(x)$ characterizing a second pre-aging light brightness curve, according to the intensity of the variable magnetic field and the light brightness of the OLED device under the second luminous constraint after aging of the OLED device, and constructing a first post-aging light brightness function $f_{12}(x)$ characterizing a first post-aging light brightness curve, according to the intensity of the variable magnetic field and the light brightness of the OLED device under the first luminous constraint after aging of the OLED device, and constructing a second post-aging light brightness function $f_{22}(x)$ characterizing a second post-aging light brightness curve, according to the intensity of the variable magnetic field and the light brightness of the OLED device under the second luminous constraint after aging of the OLED device.

The difference operating sub-circuit 202 is configured for constructing the first light brightness difference function $f_1(x)$, according to the first pre-aging light brightness function $f_{11}(x)$ and the second pre-aging light brightness function $f_{21}(x)$; and constructing the second light brightness difference function $f_2(x)$, according to the first post-aging light brightness function $f_{12}(x)$ and the second post-aging light brightness function $f_{22}(x)$; wherein, $f_1(x)=|f_{11}(x)-f_{21}(x)|$, $f_2(x)=|f_{12}(x)-f_{22}(x)|$.

In at least some of embodiments, with reference to FIG. 7, the function construction circuit 200 constructs the first light brightness difference function $f_1(x)$ by using a method below:

before aging of the OLED device, constructing, by the function constructing sub-circuit 201, the first pre-aging light brightness function $f_{11}(x)$ characterizing the first pre-aging light brightness curve, according to the intensity of the variable magnetic field and the light brightness of the OLED device under the first luminous constraint;

before aging of the OLED device, constructing, by the function constructing sub-circuit 201, the second pre-aging light brightness function $f_{21}(x)$ characterizing the second pre-aging light brightness curve, according to the intensity of the variable magnetic field and the light brightness of the OLED device under the second luminous constraint;

constructing, by the difference operating sub-circuit 202, the first light brightness difference function $f_1(x)$, according to the first pre-aging light brightness function $f_{11}(x)$ and the second pre-aging light brightness function $f_{21}(x)$; wherein, $f_1(x)=|f_{11}(x)-f_{21}(x)|$.

With reference to FIG. 8, the function construction circuit 200 constructs the second light brightness difference function $f_2(x)$ by using a method below:

after aging of the OLED device, constructing, by the function constructing sub-circuit 201, the first post-aging light brightness function $f_{12}(x)$ characterizing the first post-aging light brightness curve, according to the intensity of the variable magnetic field and the light brightness of the OLED device under the first luminous constraint;

after aging of the OLED device, constructing, by the function constructing sub-circuit 201, the second post-aging light brightness function $f_{22}(x)$ characterizing the second post-aging light brightness curve, according to the intensity of the variable magnetic field and the light brightness of the OLED device under the second luminous constraint;

Constructing, by the difference operating sub-circuit 202, the second light brightness difference function $f_2(x)$, according to the first post-aging light brightness function $f_{12}(x)$ and the second post-aging light brightness function $f_{22}(x)$; wherein, $f_2(x)=|f_{12}(x)-f_{22}(x)|$.

Figure 3:
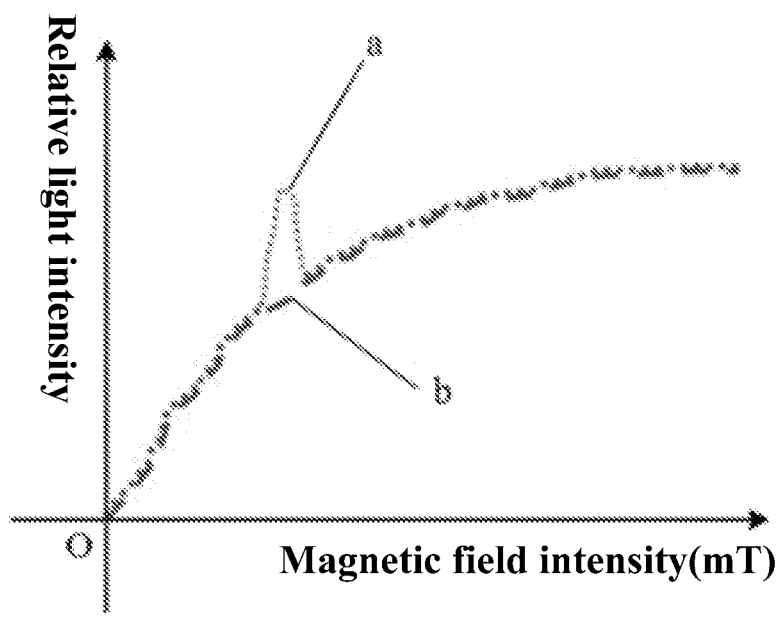
FIG. 3 is a function graph constructed by an apparatus for detecting presence of attenuation in an OLED device provided by an embodiment of the present disclosure under two various luminous constraints.
Figure 4:
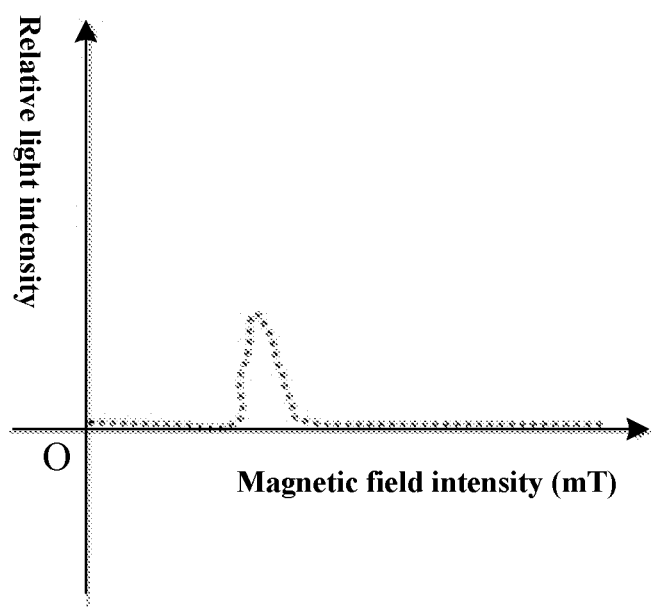
FIG. 4 is a graph of a difference function constructed by an apparatus for detecting presence of attenuation in an OLED device provided by an embodiment of the present disclosure.

Curve b of FIG. 3 shows the light brightness corresponding to the OLED device under the first luminous constraint. Curve a of FIG. 3 shows the light brightness curve corresponding to the OLED device under the second luminous constraint.

By comparing curve a and curve b, it can be found that, under the first luminous constraint, the light brightness curve of the OLED device is relatively stable, and as the intensity increases, the light brightness of the OLED device gradually increases. Under the second luminous constraint, due to the effect of the dual constraint environment of the constant microwave and the variable magnetic field, the electrons and the holes for forming the excitons in the light emitting material are capable of not only responding to change in the intensity, but also making sudden change to the light brightness of the OLED device within a certain intensity range, under the effect of the constant microwave.

It can be known from specific processes of constructing the first light brightness difference function $f_1(x)$ and constructing the second light brightness difference function $f_2(x)$ in the above-described embodiment, regardless whether before aging of the OLED device or after aging of the OLED device, in the embodiment of the present disclosure, the function under the first luminous constraint and the second luminous constraint function are always obtained firstly, and then the two functions are subtracted to obtain the corresponding difference function. As a result, in the embodiment of the present disclosure, by taking advantage of difference between responses of the electrons and the holes forming the excitons in the OLED device to the first luminous constraint and the second luminous constraint, the difference function which can reflect the number of the excitons is obtained, and by performing finite integration on the difference function, the obtained integration result is capable of characterizing the number of excitons in the OLED device.

Figure 9:
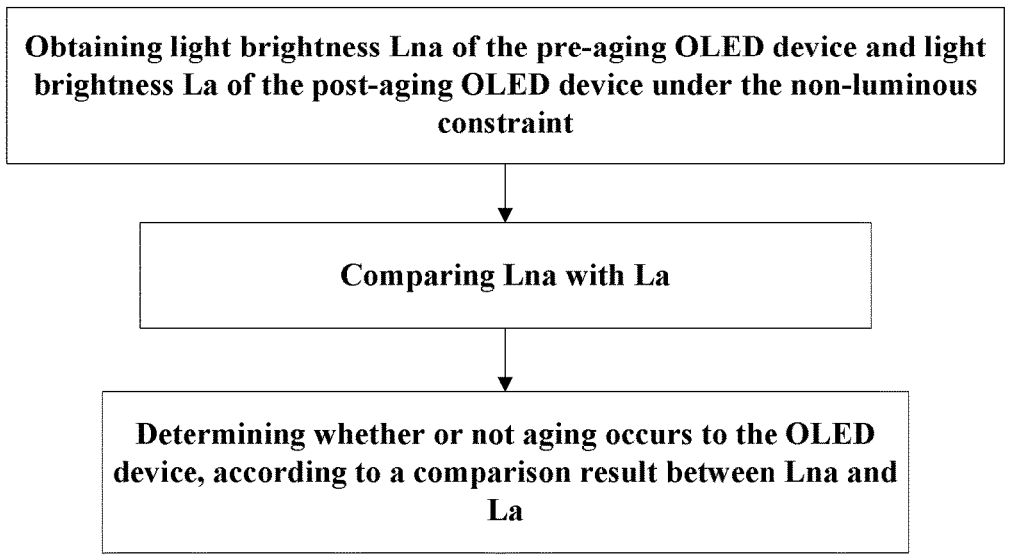
FIG. 9 is a flow chart of determining whether or not aging occurs to the OLED device in a method for detecting presence of attenuation in an OLED device provided by an embodiment of the present disclosure.

In at least some of embodiments, the apparatus for detecting presence of attenuation in the OLED device provided by the above-described embodiment further comprises a data obtaining circuit 100, an output terminal of the data obtaining circuit 100 being respectively connected with an input terminal of the difference function construction circuit 200 and an input terminal of the comparing circuit 400, with reference to FIG. 1 and FIG. 9.

As an example, the output terminal of the data obtaining circuit 100 is connected with an input terminal of the function constructing sub-circuit 201. The data obtaining circuit 100 is configured for obtaining the light brightness of the OLED device under the first luminous constraint and the light brightness of the OLED device under the second luminous constraint, before aging of the OLED device; and obtaining the light brightness of the OLED device under the first luminous constraint and the light brightness of the OLED device under the second luminous constraint, after aging of the OLED device.

As an example, the data obtaining circuit 100 is further configured for obtaining the light brightness Lna of the pre-aging OLED device under the non-luminous constraint and the light brightness La of the post-aging OLED device under the non-luminous constraint. In this case, the comparing circuit 400 is further configured for storing the light brightness Lna of the pre-aging OLED device and the light brightness La of the post-aging OLED device under the non-luminous constraint, and comparing Lna with La. The determining circuit 500 is further configured for determining whether or not aging occurs to the OLED device, according to the comparison result between Lna and La. The above-described step of determining whether or not aging occurs to the OLED device may be executed simultaneously with the determining whether or not intrinsic attenuation is present in the light emitting material of the light emitting layer in the OLED device; or, may be executed thereafter, so that it is possible to further verify the result thereof.

In at least some of embodiments, in addition to obtaining the light brightness of the OLED device under the first luminous constraint and the light brightness of the OLED device under the second luminous constraint, before aging of the OLED device, the data obtaining circuit 100 is further configured for obtaining the light brightness of the OLED device under the first luminous constraint and the light brightness of the OLED device under the second luminous constraint, after aging of the OLED device, and is further configured for obtaining the light brightness Lna of the pre-aging OLED device under the non-luminous constraint and the light brightness La of the post-aging OLED device under the non-luminous constraint.

The comparing circuit 400 stores the light brightness Lna of the pre-aging OLED device under the non-luminous constraint and the light brightness La of the post-aging OLED device under the non-luminous constraint, and compares Lna with La;

The determining circuit 500 determines whether or not aging occurs to the OLED device, according to the comparison result between Lna and La.

By connecting the output terminal of the data obtaining circuit 100 with the input terminal of the comparing circuit 400, the apparatus for detecting presence of attenuation in the OLED device provided by the embodiment of the present disclosure is capable of obtaining, with the data obtaining circuit 100, the light brightness of the pre-aging and the post-aging OLED device, under the non-luminous constraint, and determining whether aging actually occurs by using the comparing circuit 400 and the determining circuit 500; in addition, it is also capable of storing the light brightness of the pre-aging and the post-aging OLED device both under the non-luminous constraint, by the comparing circuit, so as to participate in determining whether or not intrinsic attenuation occurs to the light emitting material of the light emitting layer in the OLED device.

If La<Lna, the determining circuit 500 determines that aging occurs to the OLED device; and if La=Lna, it determines that aging does not occur to the OLED device.

Figure 5:
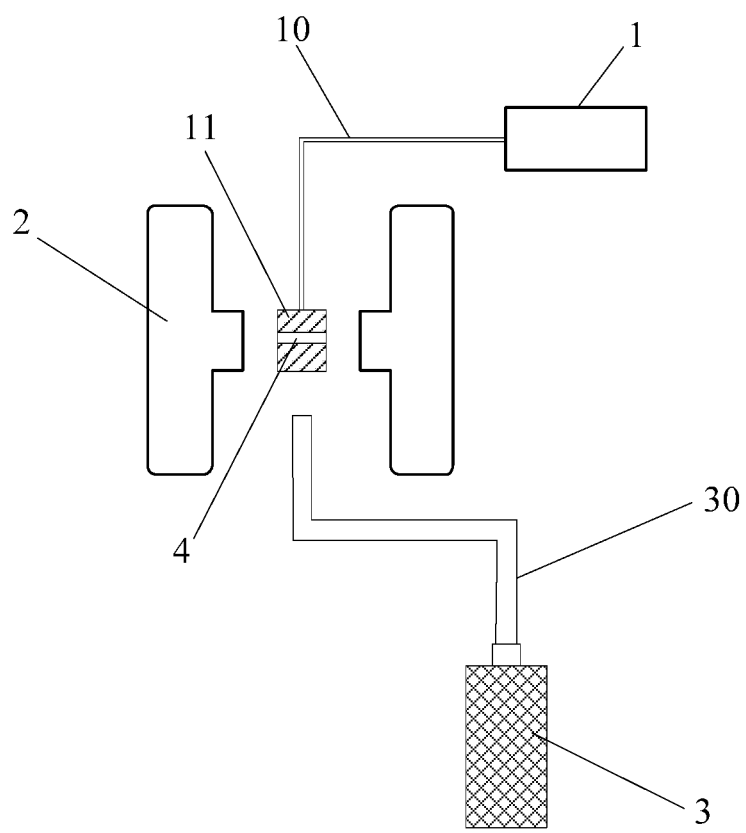
FIG. 5 is a structural schematic diagram of an OLED light brightness measuring member in an apparatus for detecting presence of attenuation in an OLED device provided by an embodiment of the present disclosure.

It should be noted that, as an example, the data obtaining circuit 100 obtains the light brightness of the OLED device by using an OLED light brightness measuring member as shown in FIG. 5. The OLED light brightness measuring member comprises a magnetic field generating member 2, a microwave generating member 1 and an optical measuring member 3. An output terminal of the optical measuring member 3 is connected with the data obtaining circuit 100. The magnetic field generating member 2 is configured for providing a variable magnetic field for the OLED device. The microwave generating member 1 is configured for providing a constant microwave for the OLED device. The microwave generating member, for example, may be implemented by a common microwave generator, which is capable of providing a microwave of a constant wavelength. The optical measuring member 3 is configured for measuring the light brightness of the OLED device under the first luminous constraint and the light brightness of the OLED device under the second luminous constraint before and after aging of the OLED device; and/or, measuring the light brightness of the OLED device under the non-luminous constraint, before and after aging of the OLED device. For example, the optical measuring apparatus may be an optical power meter or a photomultiplier tube, and may also be other apparatuses capable of measuring the light luminance.

It can be understood that, in order to facilitate the OLED device to emit light, a power supply for supplying power to the OLED device may be further provided, so that the OLED light brightness measuring member may work independently; and the power supply may be a high precision source meter, for example, keithley2400, so as to ensure supply of the constant current or the constant voltage to the OLED device, so that the OLED device will not be affected by the magnetic field and microwave and other factors.

In respective times of measurement by the OLED light brightness measuring member, the relationship between the OLED device and detecting conditions is listed in a table below.

Table 1 relationship between OLED device and detecting conditions in respective times of measurement

| OLED device state | Detecting conditions |
| --- | --- |
| Pre-aging OLED device | Non-luminous constraint |
| Post-aging OLED device | Non-luminous constraint |
| Pre-aging OLED device | First luminous constraint |
| Pre-aging OLED device | Second luminous constraint |
| Post-aging OLED device | First luminous constraint |
| Post-aging OLED device | Second luminous constraint |

For example, the magnetic field generating member 2 in the above-described embodiment is a controllable excitation power supply; a microwave stage 11 for carrying an OLED device 4 is provided in a magnetic field environment provided by the controllable excitation power supply; a transmitting terminal of the microwave generating member 1 is connected with the microwave stage 11 through a waveguide tube 10. The optical measuring member 3 collects light emitted by the OLED device through an optical fiber 30.

Because the magnetic field generating member is the controllable excitation power supply, it is ensured that the variable magnetic field can be supplied to the OLED device, so that the OLED device can emit light with different luminance in response to different magnetic field intensities.

Moreover, since the microwave stage 11 is capable of carrying the OLED device, and the transmitting terminal of the microwave generating member 1 is connected with the microwave stage 11 through the waveguide tube 10, the microwave stage 11 is also equivalent to an injecting circuit for injecting a constant microwave into the OLED device, and the microwave stage 11 is located in the variable magnetic field.

It should be noted that, ranges of the microwave wavelength and the intensity in the above-described embodiments are specifically selected. For example, the microwave generator provides a microwave at any frequency of 10 GHz to 20 GHz, for example, 10 GHz, 13 GHz, or 20 GHz. The intensity range of the variable magnetic field is from 0 mT to 500 mT.

With reference to FIG. 6, another embodiment of the present disclosure provides a method for detecting presence of attenuation in the OLED device of an OLED device, comprising:

constructing a first light brightness difference function $f_1(x)$, according to difference between light brightness of the OLED device under a first luminous constraint and light brightness of the OLED device under a second luminous constraint, before aging of the OLED device; constructing a second light brightness difference function $f_2(x)$, according to a difference between light brightness of the OLED device under a first luminous constraint and light brightness of the OLED device under a second luminous constraint, after aging of the OLED device; wherein, the first luminous constraint is a single constraint environment, the single constraint environment is a variable magnetic field, the second luminous constraint is a dual constraint environment, the dual constraint environment includes a constant microwave and a variable magnetic field, and x is an intensity of the variable magnetic field;

integrating the first light brightness difference function $f_1(x)$, to obtain a first integration result Ena, and integrating the second light brightness difference function $f_2(x)$, to obtain a second integration result Ea, within an intensity range of the variable magnetic field;

comparing $$\frac{La}{Ea} \text{ with } \frac{Lna}{Ena};$$

wherein, Lna is light brightness of a pre-aging OLED device under a non-luminous constraint, and La is light brightness of a post-aging OLED device under the non-luminous constraint;

determining whether or not intrinsic attenuation is present in a light emitting material of a light emitting layer in the OLED device, according to a comparison result between $$\frac{La}{Ea} \text{ and } \frac{Lna}{Ena}.$$

The method for detecting presence of attenuation in the OLED device provided by the embodiment of the present disclosure has advantageous effects the same as the advantageous effects of the apparatus for detecting presence of attenuation in the OLED device provided by the above-mentioned embodiment, so the advantageous effects will not be repeated here.

As an example, before constructing the first light brightness difference function $f_1(x)$ and the second light brightness difference function $f_2(x)$ in the above-described embodiment, the light brightnesses of the OLED device under the first and second luminous constraints before aging of the OLED device and the light brightnesses of the OLED device under the first and second luminous constraints after aging of the OLED device are both obtained.

In at least some of embodiments, the process for determining whether or not intrinsic attenuation is present in a light emitting material of a light emitting layer in the OLED device, according to a comparison result between comprises:

$$\frac{La}{Ea} \text{ and } \frac{Lna}{Ena},$$

determining that intrinsic attenuation is non-present in the light emitting material of the light emitting layer in the OLED device, if $$\frac{La}{Ea} \geq \frac{Lna}{Ena};$$

determining that intrinsic attenuation is present in the light emitting material of the light emitting layer in the OLED device, if $$\frac{La}{Ea} < \frac{Lna}{Ena}.$$

It should be noted that, ranges of the microwave wavelength and the intensity in the above-described embodiments are specifically selected. For example, the microwave generator provides microwaves at any frequency of 10 GHz to 20 GHz, for example, 10 GHz, 13 GHz, or 20 GHz. The intensity range of the variable magnetic field is from 0 mT to 500 mT.

In at least some of embodiments, with reference to FIG. 7, the process for constructing a first light brightness difference function $f_1(x)$, according to a difference between light brightness of the OLED device under a first luminous constraint and light brightness of the OLED device under a second luminous constraint, before aging of the OLED device, comprises:

constructing a first pre-aging light brightness function $f_{11}(x)$ characterizing a first pre-aging light brightness curve, according to the intensity of the variable magnetic field and the light brightness of the OLED device under the first luminous constraint before aging of the OLED device;

constructing a second pre-aging light brightness function $f_{21}(x)$ characterizing a second pre-aging light brightness curve, according to the intensity of the variable magnetic field and the light brightness of the OLED device under the second luminous constraint before aging of the OLED device;

constructing the first light brightness difference function $f_1(x)$, according to the first pre-aging light brightness function $f_{11}(x)$ and the second pre-aging light brightness function $f_{21}(x)$; wherein, $f_1(x)=|f_{11}(x)-f_{21}(x)|$.

In at least some of embodiments, with reference to FIG. 8, the process for constructing a second light brightness difference function $f_2(x)$, according to a difference between light brightness of the OLED device under a first luminous constraint and light brightness of the OLED device under a second luminous constraint, after aging of the OLED device, comprises:

constructing a first post-aging light brightness function $f_{12}(x)$ characterizing a first post-aging light brightness curve, according to the intensity of the variable magnetic field and the light brightness of the OLED device under the first luminous constraint after aging of the OLED device, and constructing a second post-aging light brightness function $f_{22}(x)$ characterizing a second post-aging light brightness curve, according to the intensity of the variable magnetic field and the light brightness of the OLED device under the second luminous constraint after aging of the OLED device;

constructing the second light brightness difference function $f_2(x)$, according to the first post-aging light brightness function $f_{12}(x)$ and the second post-aging light brightness function $f_{22}(x)$; wherein, $f_2(x)=|f_{12}(x)-f_{22}(x)|$.

In at least some of embodiments, with reference to FIG. 9, the method for detecting presence of attenuation in the OLED device provided by the above-described embodiment further comprises:

obtaining light brightness Lna of the pre-aging OLED device under the non-luminous constraint and light brightness La of the post-aging OLED device under the non-luminous constraint;

storing the light brightness Lna of the pre-aging OLED device and the light brightness La of the post-aging OLED device, and comparing Lna with La; and determining whether or not aging occurs to the OLED device, according to a comparison result between Lna and La.

The above-described process of determining whether or not aging occurs to the OLED device may be executed simultaneously with the determining whether or not intrinsic attenuation is present in the light emitting material of the light emitting layer in the OLED device; or, may be executed after the determining whether or not intrinsic attenuation is present in the light emitting material of the light emitting layer in the OLED device, to further verify the result thereof.

In at least some of embodiments, the process for determining whether or not aging occurs to the OLED device, according to a comparison result between Lna and La, comprises:

determining that aging occurs to the OLED device, if La<Lna; and determining that aging does not occur to the OLED device, if La=Lna.

In the apparatus and the method for detecting presence of attenuation in the OLED device provided by the embodiments of the present disclosure, the first luminous constraint is the single constraint environment of the variable magnetic field, so that regardless whether in the pre-aging OLED device or in the post-aging OLED device, both the electrons and the holes for forming the excitons are capable of responding to change in the intensity, to emit light of different luminance; and the second luminous constraint is the dual constraint environment of the constant microwave and the variable magnetic field, so that regardless whether in the pre-aging OLED device or in the post-aging OLED device, both the electrons and the holes for forming the excitons are capable of not only responding to change in the intensity, but also making sudden change to the light brightness within a certain intensity range, under the effect of the constant microwave. In this way, by constructing, with the difference function construction circuit, the first light brightness difference function $f_1(x)$ and the second light brightness difference function $f_2(x)$, according to the difference between the light brightness of the OLED device under the first luminous constraint and the light brightness of the OLED device under the second luminous constraint, before and after aging of the OLED device, and by integrating the same within the intensity range of the variable magnetic field, the first integration result Ena characterizing the number of excitons in the pre-aging OLED device, and the second integration result Ea characterizing the number of excitons in the post-aging OLED device may be obtained; however, considering the intrinsic attenuation of the light-emitting material in the light-emitting layer of the OLED device, the probability of the radiation transition present in the light-emitting layer in the OLED device decreases relative to that of the non-radiation transition, and the light emission brightness of the OLED device can characterize the probability of the radiation transition, it is possible to compare a ratio $$\frac{Lna}{Ena}$$

of the pre-aging OLED device with a ratio $$\frac{La}{Ea}$$

of the post-aging OLED device, so as to determine whether or not intrinsic attenuation is present in the light emitting material of the light emitting layer in the OLED device.

Those skilled in the art shall understand that the embodiments of the disclosure are able to be provided as a method, a system or a computer program product. Therefore, the disclosure can adopt forms of a complete hardware embodiment, a complete software embodiment or embodiment combining software and hardware. In addition, the disclosure can adopt the form of computer program product that is implemented on one or more computer applicable storage mediums (comprising, but not limited, disk memory, CD-ROM, optical memory, etc.) comprising computer applicable program codes therein.

The disclosure is described herein with reference to flowchart charts and/or block diagrams of methods, apparatuses (systems), and computer program products according to the embodiments of the disclosure. It should be understood that each flow and/or block in the flowchart and/or block diagram, and a combination of flow and/or block in the flowchart and/or block diagram can be implemented by computer program instructions. These computer program instructions may be provided to a general purpose computer, a special purpose computer, an embedded processor or a processor of other programmable data processing apparatus to form a machine, such that devices for implementing functions specified by one or more flows in the flowchart and/or one or more blocks in the block diagram may be generated by executing the instructions with the processor of the computer or other programmable data processing apparatus.

These computer program instructions may also be stored in a computer-readable memory that can direct the computer or other programmable data processing apparatus to operate in a given manner, so that the instructions stored in the computer-readable memory produce a manufactured article comprising an instruction device, and the instruction device implements the functions specified by one or more flows in the flowchart and/or one or more blocks in the block diagram.

These computer program instructions may also be loaded onto the computer or other programmable data processing apparatus, such that a series of process steps may be executed on the computer or other programmable data processing apparatus to produce process implemented by the computer, thereby, the instructions executed on the computer or other programmable data processing apparatus provide steps of implementing the functions specified by one or more flows in the flowchart and/or one or more blocks in the block diagram.

What is described above is related to the illustrative embodiments of the disclosure only and not limitative to the scope of the disclosure; the scopes of the disclosure are defined by the accompanying claims.

This application claims priority of Chinese Patent Application No. 201610634740.X filed on Aug. 4, 2016, the disclosure of which is incorporated herein by reference in its entirety as part of the present application.

The invention claimed is:

1. An apparatus for detecting a presence of an attenuation in an organic light emitting display (OLED) device, comprising:
   a difference function construction circuit, configured for constructing a first light brightness difference function $f_1(x)$, according to a difference between a light brightness of the OLED device under a first luminous constraint and a light brightness of the OLED device under a second luminous constraint, before aging of the OLED device; constructing a second light brightness difference function $f_2(x)$, according to a difference between a light brightness of the OLED device under the first luminous constraint and a light brightness of the OLED device under the second luminous constraint, after aging of the OLED device; wherein the first luminous constraint comprises a variable magnetic field, the second luminous constraint comprises a constant microwave and a variable magnetic field, and x is an intensity of the variable magnetic field;
   an integrating circuit, configured for integrating the first light brightness difference function $f_1(x)$, to obtain a first integration result Ena, and integrating the second light brightness difference function $f_2(x)$, to obtain a second integration result Ea, within an intensity range of the variable magnetic field;
   a comparing circuit, configured for comparing $$\frac{La}{Ea} \text{ with } \frac{Lna}{Ena};$$

wherein, Lna is a light brightness of a pre-aging OLED device under a non-luminous constraint, and La is a light brightness of a post-aging OLED device under the non-luminous constraint; and
   a determining circuit, configured for determining the presence of an intrinsic attenuation in a light emitting material of a light emitting layer in the OLED device, according to a comparison result between $$\frac{La}{Ea} \text{ and } \frac{Lna}{Ena}.$$

2. The apparatus according to claim 1, wherein the difference function construction circuit comprises a function constructing sub-circuit and a difference operating sub-circuit connected with an output terminal of the function constructing sub-circuit; and the output terminal of the difference operating sub-circuit is connected with an input terminal of the integrating circuit;
   the function constructing sub-circuit is configured for storing the intensity of the variable magnetic field, constructing a first pre-aging light brightness function $f_{11}(x)$ characterizing a first pre-aging light brightness curve, according to the intensity of the variable magnetic field and the light brightness of the OLED device under the first luminous constraint before aging of the OLED device, and constructing a second pre-aging light brightness function $f_{21}(x)$ characterizing a second pre-aging light brightness curve, according to the intensity of the variable magnetic field and the light brightness of the OLED device under the second luminous constraint before aging of the OLED device; constructing a first post-aging light brightness function $f_{12}(x)$ characterizing a first post-aging light brightness curve, according to the intensity of the variable magnetic field and the light brightness of the OLED device under the first luminous constraint after aging of the OLED device, and constructing a second post-aging light brightness function $f_{22}(x)$ characterizing a second post-aging light brightness curve, according to the intensity of the variable magnetic field and the light brightness of the OLED device under the second luminous constraint after aging of the OLED device;
   the difference operating sub-circuit is configured for constructing the first light brightness difference function $f_1(x)$, according to the first pre-aging light brightness function $f_{11}(x)$ and the second pre-aging light brightness function $f_{21}(x)$; and constructing the second light brightness difference function $f_2(x)$, according to the first post-aging light brightness function $f_{12}(x)$ and the second post-aging light brightness function $f_{22}(x)$; wherein, $f_1(x)=|f_{11}(x)-f_{21}(x)|$, $f_2(x)=|f_{12}(x)-f_{22}(x)|$.

3. The apparatus according to claim 1, wherein the determining circuit is configured for determining that the intrinsic attenuation is non-present in the light emitting material of the light emitting layer in the OLED device, if $$\frac{La}{Ea} \geq \frac{Lna}{Ena};$$

and determining that the intrinsic attenuation is present in the light emitting material of the light emitting layer in the OLED device, if $$\frac{La}{Ea} < \frac{Lna}{Ena}.$$

4. The apparatus according to claim 1, further comprising a data obtaining circuit, wherein an output terminal of the data obtaining circuit is connected with an input terminal of the difference function construction circuit and an input terminal of the comparing circuit;
   the data obtaining circuit is configured for obtaining the light brightness of the OLED device under the first luminous constraint and the light brightness of the OLED device under the second luminous constraint, before and after aging of the OLED device; and further configured for obtaining light brightness Lna of the pre-aging OLED device under the non-luminous constraint and the light brightness La of the post-aging OLED device under the non-luminous constraint;
   the comparing circuit is configured for storing the light brightness Lna of the pre-aging OLED device under the non-luminous constraint and the light brightness La of the post-aging OLED device under the non-luminous constraint, and comparing Lna with La; and the determining circuit is further configured for determining whether or not aging of the OLED device has occurred, according to the comparison result between Lna and La.

5. The apparatus according to claim 4, wherein the determining circuit is configured for determining that aging of the OLED device has occurred, if La<Lna; and determining that aging of the OLED device has not occurred, if La=Lna.

6. The apparatus according to claim 4, further comprising: a magnetic field generating member, a microwave generating member, and an optical measuring member; an output terminal of the optical measuring member being connected with the data obtaining circuit;
the magnetic field generating member is configured for providing a variable magnetic field for the OLED device;
the microwave generating member is configured for providing a constant microwave for the OLED device; and
the optical measuring member is configured for measuring the light brightness of the OLED device under the first luminous constraint and the light brightness of the OLED device under the second luminous constraint, before and after aging of the OLED device; and, measuring the light brightness of the OLED device under the non-luminous constraint, before and after aging of the OLED device.

7. The apparatus according to claim 6, wherein the magnetic field generating member is a controllable excitation power supply; a microwave stage for carrying the OLED device is provided in a magnetic field provided by the controllable excitation power supply; and a transmitting terminal of the microwave generating member is connected with the microwave stage through a waveguide tube.

8. The apparatus according to claim 6, wherein the optical measuring member is an optical power meter or a photomultiplier tube.

9. The apparatus according to claim 6, further comprising a power supply for supplying power for the OLED device.

10. The apparatus according to claim 1, wherein a microwave frequency of the constant microwave ranges from 10 GHz to 20 GHz, and the intensity of the variable magnetic field ranges from 0 mT to 500 mT.

11. A method for detecting a presence of an attenuation in an organic light emitting display (OLED) device, comprising:
constructing, by a difference function construction circuit, a first light brightness difference function $f_1(x)$, according to a difference between alight brightness of the OLED device under a first luminous constraint and a light brightness of the OLED device under a second luminous constraint, before aging of the OLED device;
constructing, by the difference function construction circuit, a second light brightness difference function $f_2(x)$, according to a difference between a light brightness of the OLED device under the first luminous constraint and a light brightness of the OLED device under the second luminous constraint, after aging of the OLED device; wherein the first luminous constraint comprises a constant microwave and a variable magnetic field, and x is an intensity of the variable magnetic field;
integrating, by an integrating circuit, the first light brightness difference function $f_1(x)$, to obtain a first integration result Ena, and integrating, by the integrating circuit, the second light brightness difference function $f_2(x)$, to obtain a second integration result Ea, within an intensity range of the variable magnetic field;
comparing, by a comparing circuit, $$\frac{La}{Ea} \text{ with } \frac{Lna}{Ena};$$

wherein, Lna is light brightness of a pre-aging OLED device under a non-luminous constraint, and La is a light brightness of a post-aging OLED device under the non-luminous constraint; and
determining, by a determining circuit, the presence of the intrinsic attenuation in a light emitting material of a light emitting layer in the OLED device, according to a comparison result between $$\frac{La}{Ea} \text{ and } \frac{Lna}{Ena}.$$

12. The method according to claim 11, wherein the constructing, by the difference function construction circuit, the first light brightness difference function $f_1(x)$, according to the difference between light brightness of the OLED device under the first luminous constraint and light brightness of the OLED device under the second luminous constraint, before aging of the OLED device, comprises:
constructing, by a function constructing sub-circuit, a first pre-aging light brightness function $f_{11}(x)$ characterizing a first pre-aging light brightness curve, according to the intensity of the variable magnetic field and the light brightness of the OLED device under the first luminous constraint before aging of the OLED device;
constructing by the function constructing sub-circuit, a second pre-aging light brightness functions $f_{21}(x)$ characterizing a second pre-aging light brightness curve, according to the intensity of the variable magnetic field and the light brightness of the OLED device under the second luminous constraint before aging of the OLED device;
constructing, by a difference operating sub-circuit, the first light brightness difference function $f_1(x)$, according to the first pre-aging light brightness function $f_{11}(x)$ and the second pre-aging light brightness function $f_{21}(x)$; wherein, $f_1(x)=|f_{11}(x)-f_{21}(x)|$.

13. The method according to claim 11, wherein the constructing, by the difference function construction circuit, the second light brightness difference function $f_2(x)$, according to the difference between light brightness of the OLED device under the first luminous constraint and a light brightness of the OLED device under the second luminous constraint, after aging of the OLED device, comprises:
constructing, by a function constructing sub-circuit, a first post-aging light brightness function $f_{12}(x)$ characterizing a first post-aging light brightness curve, according to the intensity of the variable magnetic field and the light brightness of the OLED device under the first luminous constraint after aging of the OLED device, and constructing, by the function constructing sub-circuit, a second post-aging light brightness function $f_{22}(x)$ characterizing a second post-aging light brightness curve, according to the intensity of the variable magnetic field and the light brightness of the OLED device under the second luminous constraint after aging of the OLED device;

constructing, by a difference operating sub-circuit, the second light brightness difference function $f_2(x)$, according to the first post-aging light brightness function $f_{12}(x)$ and the second post-aging light brightness function $f_{22}(x)$; wherein, $f_2(x)=|f_{12}(x)-f_{22}(x)|$.

14. The method according to claim 11, wherein the determining, by the determining circuit, the presence of intrinsic attenuation in the light emitting material of the light emitting layer in the OLED device, according to the comparison result between $$\frac{La}{Ea} \text{ and } \frac{Lna}{Ena}$$

comprises:
  determining, by the determining circuit, that the intrinsic attenuation is present in the light emitting material of the light emitting layer in the OLED device, if $$\frac{La}{Ea} \geq \frac{Lna}{Ena};$$

and determining by the determining circuit, that the intrinsic attenuation is present in the light emitting material of the light emitting layer in the OLED device, if $$\frac{La}{Ea} < \frac{Lna}{Ena}.$$

15. The method according to claim 11, further comprising:
  obtaining, by a data obtaining circuit, the light brightness of the OLED device under the first luminous constraint and the light brightness of the OLED device under the second luminous constraint, before and after aging of the OLED device; and obtaining the light brightness Lna of the pre-aging OLED device under the non-luminous constraint and the light brightness La of the post-aging OLED device under the non-luminous constraint;
  storing, by the comparing circuit, the light brightness Lna of the pre-aging OLED device under the non-luminous constraint and the light brightness La of the post-aging OLED device under the non-luminous constraint, and comparing Lna with La;
  determining, by the determining circuit, whether or not aging of the OLED device has occurred, according to the comparison result between Lna and La.

16. The method according to claim 15, wherein the determining, by the determining circuit, whether or not aging of the OLED device has occurred, according to the comparison result between Lna and La comprises:
  determining, by the determining circuit, that aging of the OLED device has occurred, if La<Lna; and determining by the determining circuit, that aging of the OLED device has not occurred, if La=Lna.

17. The method according to claim 11, wherein the intensity of the variable magnetic field ranges from 0 mT to 500 mT, and a microwave frequency of the constant microwave ranges from 10 GHz to 20 GHz.

18. The apparatus according to claim 2, wherein the determining circuit is configured for determining that the intrinsic attenuation is non-present in the light emitting material of the light emitting layer in the OLED device, if $$\frac{La}{Ea} \geq \frac{Lna}{Ena};$$

and determining that the intrinsic attenuation is present in the light emitting material of the light emitting layer in the OLED device, if $$\frac{La}{Ea} < \frac{Lna}{Ena}.$$

19. The method according to claim 12, wherein the constructing, by the difference function construction circuit, the second light brightness difference function $f_2(x)$, according to the difference between light brightness of the OLED device under the first luminous constraint and light brightness of the OLED device under the second luminous constraint, after aging of the OLED device, comprises:
  constructing, by the function constructing sub-circuit, a first post-aging light brightness function $f_{12}(x)$ characterizing a first post-aging light brightness curve, according to the intensity of the variable magnetic field and the light brightness of the OLED device under the first luminous constraint after aging of the OLED device, and constructing, by the function constructing sub-circuit, a second post-aging light brightness function $f_{22}(x)$ characterizing a second post-aging light brightness curve, according to the intensity of the variable magnetic field and the light brightness of the OLED device under the second luminous constraint after aging of the OLED device;
  constructing, by the difference operating sub-circuit, the second light brightness difference function $f_2(x)$, according to the first post-aging light brightness function $f_{12}(x)$ and the second post-aging light brightness function $f_{22}(x)$; wherein, $f_2(x)=|f_{12}(x)-f_{22}(x)|$.

* * * * *